(12) United States Patent
Kim et al.

(10) Patent No.: US 12,131,768 B2
(45) Date of Patent: Oct. 29, 2024

(54) DYNAMIC RANDOM ACCESS MEMORY (DRAM) MULTI-WORDLINE DIRECT REFRESH MANAGEMENT INCLUDING ALIASING ROW COUNTER POLICY FOR ROW HAMMER MITIGATION

(71) Applicant: Micron Technology, Inc., Boise, ID (US)

(72) Inventors: Kang-Yong Kim, Boise, ID (US); Yang Lu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 246 days.

(21) Appl. No.: 17/896,337

(22) Filed: Aug. 26, 2022

(65) Prior Publication Data

US 2023/0238045 A1    Jul. 27, 2023

Related U.S. Application Data

(60) Provisional application No. 63/302,400, filed on Jan. 24, 2022.

(51) Int. Cl.
| | |
|---|---|
| *G11C 11/406* | (2006.01) |
| *G11C 11/4078* | (2006.01) |
| *G11C 11/408* | (2006.01) |

(52) U.S. Cl.
CPC .. *G11C 11/40618* (2013.01); *G11C 11/40615* (2013.01); *G11C 11/4078* (2013.01); *G11C 11/4085* (2013.01)

(58) Field of Classification Search
None
See application file for complete search history.

(56) References Cited

U.S. PATENT DOCUMENTS

2016/0125931 A1* 5/2016 Doo .................. G11C 11/406
                                                    365/222
2017/0011792 A1* 1/2017 Oh ................. G11C 11/4076
(Continued)

FOREIGN PATENT DOCUMENTS

CN           113342615 A  *  9/2021  .......... G06F 11/3037

OTHER PUBLICATIONS

Seyedzadeh et al. "Counter-Based Tree Structure for Row Hammering Mitigation in DRAM" IEEE Computer Architecture Letters, vol. 16, No. 1, Jan.-Jun. 2017, pp. 18-21. (Year: 2017).*

*Primary Examiner* — J. H. Hur
(74) *Attorney, Agent, or Firm* — Wood IP LLC; Theodore A. Wood

(57) ABSTRACT

Systems and methods for multi-wordline direct refresh operations in response to a row hammer error in a memory bank. The approach includes detecting, by a row hammer mitigation component, a row hammer error in a memory bank; and then triggering, by the row hammer mitigation component, a response to the row hammer error. Further, a memory controller receives, from a mode register, data, based on an aliasing row counter policy, selecting a type of multi-wordline direct refresh operation to be performed on a plurality of victim memory rows within the memory bank, wherein the plurality of victim memory rows are dispersed across a plurality of memory sub-banks. The approach includes concurrently executing the selected multi-wordline direct refresh operation to the plurality of victim memory rows.

20 Claims, 9 Drawing Sheets

(56) References Cited

U.S. PATENT DOCUMENTS

| | | | |
|---|---|---|---|
| 2017/0117030 A1* | 4/2017 | Fisch | G11C 11/4078 |
| 2019/0073161 A1* | 3/2019 | Nale | G06F 13/20 |
| 2019/0228813 A1* | 7/2019 | Nale | G06F 3/0659 |
| 2020/0043545 A1* | 2/2020 | Gans | G11C 11/408 |
| 2021/0158853 A1* | 5/2021 | Wang | G11C 11/40611 |
| 2023/0238046 A1* | 7/2023 | Gieske | G11C 11/40618 |
| | | | 365/222 |

* cited by examiner

| MR[x:y] | Function |
|---|---|
| 00 | 1x WL DRFM (standard DRFM) |
| 01 | 2x WL DRFM (RA[16]) |
| 10 | 4x WL DRFM (RA[16:15]) |
| 11 | 8x WL DRFM (RA[16:14]) |

| RA[14:0] | SEC0 | ... | SEC19 | SEC20 | ... | SEC39 | SEC40 | ... | SEC59 | SEC60 | ... | SEC79 |
|---|---|---|---|---|---|---|---|---|---|---|---|---|
| RA[15] | 0 | | | 1 | | | 0 | | | 1 | | |
| RA[16] | 0 | | | | | | 1 | | | | | |

DYNAMIC RANDOM ACCESS MEMORY (DRAM) MULTI-WORDLINE DIRECT REFRESH MANAGEMENT INCLUDING ALIASING ROW COUNTER POLICY FOR ROW HAMMER MITIGATION

PRIORITY AND CROSS REFERENCE TO RELATED APPLICATIONS

This application claims priority from U.S. Provisional Application No. 63/302,400, filed Jan. 24, 2022, the contents of which is hereby incorporated by reference. Additionally, this application is related to the following U.S. Patent Applications: U.S. Appl. No. 63/303,910, "Practical Space Saving Row Hammer Detector," filed on Jan. 27, 2022; U.S. Appl. No. 63/303,550, "Deterministic RAS Clobber and RH Mitigation Combines Solution for CXL Controller," filed on Jan. 27, 2022; and U.S. Appl. No. 63/302,051, "Aliased Row Hammer Detector," filed on Jan. 22, 2022; the contents of each of which are hereby incorporated by reference.

FIELD OF TECHNOLOGY

The present disclosure relates to detection and response to row hammer events in memory media.

BACKGROUND

Memory devices (also referred to as "memory media devices") are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), flash memory, and others. Memory devices may be volatile or non-volatile. Volatile memory cells (e.g., DRAM cells) may lose their programmed states over time unless they are periodically refreshed by an external power source. SRAM memory may maintain their programmed states for the duration of the system being powered on. Non-volatile memory cells (e.g., NAND memory cells) may maintain their programmed states for extended periods of time even in the absence of an external power source.

Memory devices may be coupled to a host (e.g., a host computing device) to store data, commands, and/or instructions for use by the host while the computer or other electronic system is operating. For example, data, commands, and/or instructions can be transferred between the host and the memory device(s) during operation of a computing or other electronic system. A controller, also referred to as a "memory controller," may be used to manage the transfer of data, commands, and/or instructions between the host and the memory devices.

BRIEF DESCRIPTION OF THE DRAWINGS

FIG. 3A illustrates a mode register in a row hammer mitigation component, according to an embodiment of the present disclosure.

FIG. 4 illustrates an example of a memory bank with a single DRFM command, according to an embodiment of the present disclosure.

FIG. 5 illustrates an example of a memory bank with a 2× wordline aliasing mode multi-wordline DRFM command, according to an embodiment of the present disclosure.

DETAILED DESCRIPTION

Currently, correcting row hammer corruption takes multiple sequential issues of activation (ACT) commands to refresh victim rows that are typically +/−one and +/−two rows from the targeted row, or as also referred to as the aggressor row. Therefore, in the example of refreshing the affected four victim rows, i.e., the two +/−"one" rows and the two +/−"two" rows, four different ACT commands must be issued.

As will be discussed, in the case of memory aliasing where multiple entries are mapped to share the same memory location, e.g., where multiple rows per memory bank, divided into multiple memory sub-banks, share the same row hammer counter, the number of victim rows can double and quadruple. In that case the number of ACT commands that need to be issued may increase from four for a single sub-bank to eight or sixteen for two or four memory sub-banks. In such cases the memory bandwidth becomes severely compromised. Thus, an approach to minimize the number of required ACT commands in response to a row hammer event in aliased memory is desired.

Figure 1:
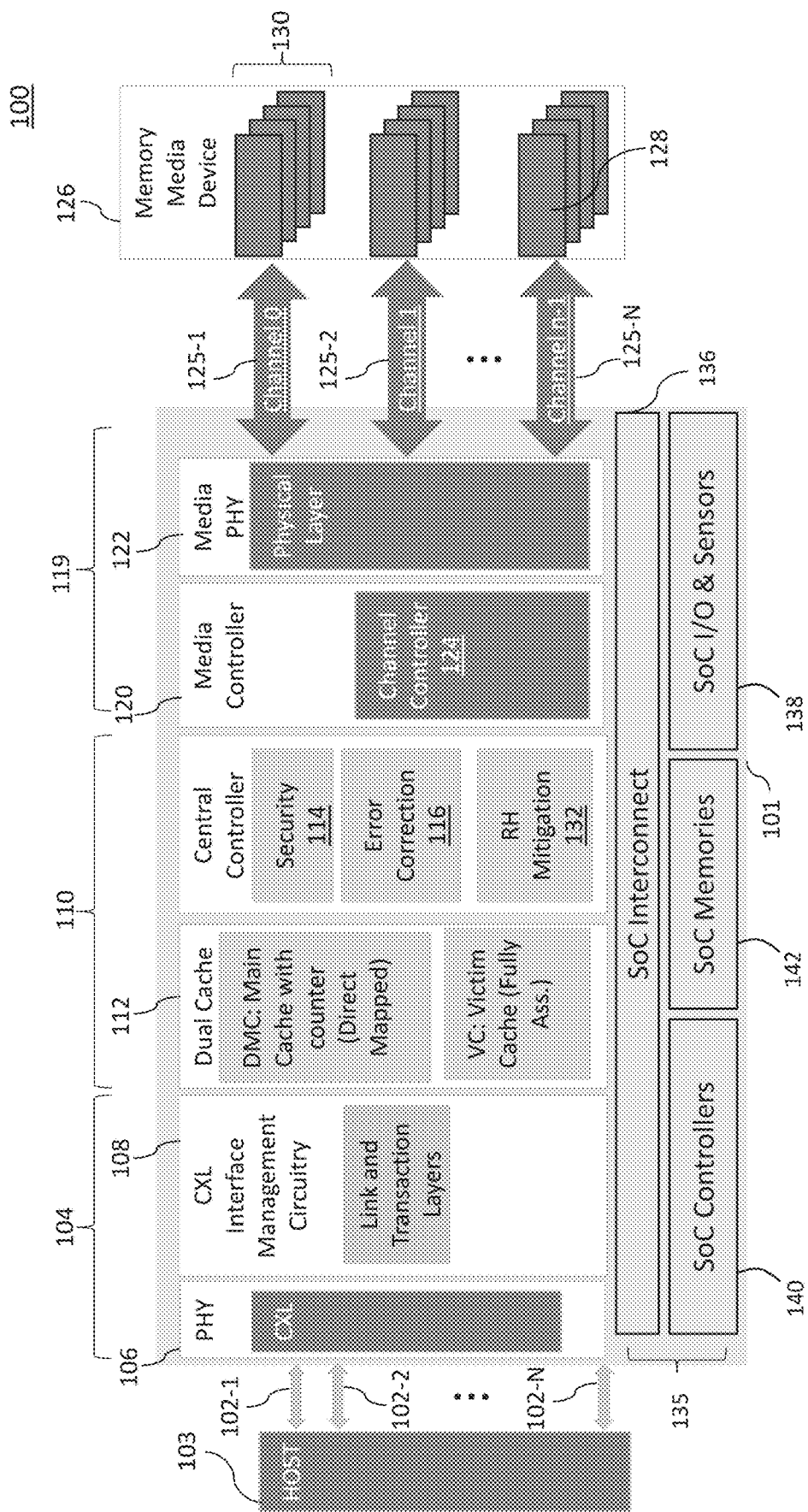
FIG. 1 illustrates an example functional block diagram in the form of a computing system, according to an embodiment of the present disclosure.

FIG. 1 illustrates an example functional block diagram in the form of a computing system 100 in an embodiment of the present disclosure. The computing system 100 may include including a memory controller 101 configured for detecting row hammer attacks, also known as a row hammer error, and mitigating such row hammer attacks on one or more memory media devices 126. The memory controller 101 may include a front-end portion 104, a central controller portion 110, a back-end portion 119, and a management unit 135. The memory controller 101 can be coupled to a host 103 (i.e., host system 103) and memory media device 126. In some embodiments, memory media device 126 may be a DRAM device.

The front-end portion 104 includes an interface 106 to couple the memory controller 101 to the host 103 through one or more input/output (I/O) lanes 102. The communications over I/O lanes 102 may be according to a protocol such as, for example, Peripheral Component Interconnect Express (PCIe). In some embodiments, the plurality of I/O lanes 102 can be configured as a single port. Example embodiments are not limited by the number of I/O lanes, whether or not the I/O lanes belong to a single port, or the communication protocol for communicating with the host.

The interface 106 receives data and/or commands from host 103 through I/O lanes 102. In an embodiment, the interface 106 is a physical (PHY) interface configured for PCIe communications. The front-end portion 104 may include interface management circuitry 108 (including data link and transaction layer control) which may provide higher layer protocol support for communications with host 103 through PHY interface 106.

The central controller portion 110 is configured to control, in response to receiving a request or command from host 103, performance of a memory operation. The memory operation can be a memory operation to read data from, or write data to, memory media device 126. The central controller portion 110 may comprise a cache memory 112 to store data associated with the performance of the memory operation, a security component 114 configured to encrypt the data before storing, and to decrypt data after reading, the data in memory media device 126.

In some embodiments, in response to receiving a request from host 103, data from host 103 can be stored in cache lines of cache memory 112. The data in the cache memory can be written to memory media device 126. An error correction component 116 is configured to provide error correction to data read from and/or written to memory media device 126. In some embodiments, the data can be encrypted using an encryption protocol such as, for example, Advanced Encryption Standard (AES) encryption, before the data is stored in the cache memory. In some embodiments, the central controller portion 110 can, in response to receiving a request from host 103, control writing of multiple pages of data substantially simultaneously to memory media device 126.

The management unit 135 is configured to control operations of the memory controller 101. The management unit may recognize commands from the host 103 and accordingly manage the one or more memory media devices 126. In some embodiments, the management unit 135 includes an I/O bus 138 to manage out-of-band data, a management unit controller 140 to execute a firmware whose functionalities include, but not limited to, monitoring and configuring the characteristics of the memory controller 101, and a management unit memory 142 to store data associated with memory controller 101 functionalities. The management unit controller 140 may also execute instructions associated with initializing and configuring the characteristics of the memory controller 101. An endpoint of the management unit 135 can be exposed to the host system 103 to manage data through a communication channel using the I/O bus 138.

A second endpoint of the management unit 135 can be exposed to the host system 103 to manage data through a communication channel using interface 106. In some embodiments, the characteristics monitored by the management unit 135 can include a voltage supplied to the memory controller 101 or a temperature measured by an external sensor, or both. Further, the management unit 135 can include a local bus interconnect 136 to couple different components of the memory controller 101. In some embodiments, the local bus interconnect 136 can include, but is not limited to, an advanced high-performance bus (AHB).

The management unit 135 can include a management unit controller 140. In some embodiments, the management unit controller 140 can be a controller that meets the Joint Test Action Group (JTAG) standard and operate according to an Inter-Integrate Circuit (I2C) protocol, and auxiliary I/O circuitry. As used herein, the term "JTAG" generally refers to an industry standard for verifying designs and testing printed circuitry boards after manufacture. As used herein, the term "I2C" generally refers to a serial protocol for a two-wire interface to connect low-speed devices like microcontrollers, I/O interfaces, and other similar peripherals in embedded systems.

The back-end portion 119 is configured to couple to one or more types of memory devices (e.g., DRAM memory media device 126) via (e.g., through) a plurality of channels 125, which can be used to read/write data to/from the memory media devices 126, to transmit commands to memory media device 126, to receive status and statistics from memory media device 126, etc.

The management unit 135 can couple, by initializing and/or configuring the memory controller 101 and/or the memory media device 126 accordingly, the memory controller 101 to external circuitry or an external device, such as host 103 that can generate requests to read or write data to and/or from the memory device(s). The management unit 135 is configured to recognize received commands from the host 103 and to execute instructions to apply a particular operation code associated with received host commands for each of a plurality of channels coupled to the memory media device 126.

The back-end portion 119 includes a media controller portion comprising a plurality of media controllers 120 and a physical (PHY) layer portion comprising a plurality of PHY interfaces 122. In some embodiments, the back-end portion 119 is configured to couple the PHY interfaces 122 to a plurality of memory ranks of the memory media device 126. Memory ranks can be connected to the memory controller 101 via a plurality of channels 125. A respective media controller 120 and a corresponding PHY interface 122 may drive a channel 125 to a memory rank. In some embodiments, each media controller 120 can execute commands independent of any other media controllers 120. Therefore, data can be transferred from one PHY interface 122 through a channel 125 to memory media device 126 independent of other PHY interfaces 122 and channels 125.

Each PHY interface 122 may operate in accordance with a PHY layer that couples the memory controller 101 to one or more memory ranks in the memory media device 126. As used herein, the term "PHY layer" generally refers to the physical layer in the Open Systems Interconnection (OSI) model of a computing system. The PHY layer may be the first (e.g., lowest) layer of the OSI model and can be used to transfer data over a physical data transmission medium. In some embodiments, the physical data transmission medium can be a plurality of channels 125.

As used herein, the term "memory ranks" generally refers to a plurality of memory chips (e.g., DRAM memory chips) that can be accessed simultaneously. In some embodiments, a memory media device 126 may include a plurality of memory ranks. In some embodiments, a memory rank can be sixty-four (64) bits wide, and each memory rank can have eight (8) pages. In some embodiments, a page size of a first type of memory device can be larger than a page size of the second type of memory device. Example embodiments, however, are not limited to particular widths of memory ranks or page sizes.

Each media controller 120 may include a channel control circuitry 124 and a plurality of bank control circuitry 128 where a respective one of the plurality of bank control circuitry 128 is configured to access a respective bank of memory, e.g., memory bank 130, of the plurality of banks on the memory media device 126 accessed by the respective media controller 120.

Rank, channel, and bank can be considered hardware-dependent logical groupings of storage locations in the media device. The mapping of rank, channel and bank logical groupings to physical storage locations or rows in the memory media device 126 may be preconfigured or may be configurable in some embodiments by the host system 103 and/or memory controller 101 in communication with the memory media device 126. A memory bank 130 maps to a block of memory cells in a DRAM chip, a rank includes one or more DRAM chips, and each channel may provide access to a respective group of one or more ranks. Thus, each channel provides access to a respective group of a plurality of banks. Each channel may be configured to access a respective group of one or more ranks of the memory media device 126, where each rank includes one or more DRAM chips.

A row hammer (RH) mitigation component 132 may be arranged within memory controller 101 to perform detection of soft memory errors, such as, for example, row hammer attacks, on memory media devices 126 attached to the memory controller 101. The RH mitigation component 132 may be configured to, in addition to performing detection of row hammer attacks, to upon such detection, also trigger a response to the detected error. In some embodiments, RH mitigation component 132 may receive row access statistics for the memory media device 126 and may output a response to refresh one or more rows of the memory media device 126. The RH mitigation component 132 and its operation is described below in more detail.

In some embodiments, the memory controller 101 can be a Compute Express Link™ (CXL) compliant memory system (e.g., the memory system can include a PCIe/CXL interface). CXL is a high-speed central processing unit (CPU) to device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost. CXL is designed to be an industry open standard interface for high-speed communications, as accelerators are increasingly used to complement CPUs in support of emerging applications such as artificial intelligence and machine learning.

CXL technology is built on the PCIe infrastructure, leveraging PCIe physical and electrical interfaces to provide advanced protocol in areas such as I/O protocol, memory protocol (e.g., initially allowing a host to share memory with an accelerator), and coherency interface. When the memory controller 101 is CXL compliant, the interface management circuitry 108 (including data link and transaction control) may use CXL protocols to manage the interface 106 which may comprise PCIe PHY interfaces.

According to some embodiments, the memory media device 126 includes one or more DRAM devices. In some embodiments, main memory is stored in DRAM cells that have high storage density. DRAM cells lose their state over time. That is, the DRAM cells must be refreshed periodically, hence the name "Dynamic." DRAM can be described as being organized according to a hierarchy of storage organization comprising DIMM, rank, bank, and array.

A DIMM comprises a plurality of DRAM chips, and the plurality of chips in a DIMM are organized into one or more "ranks." Each chip is formed of a plurality of "banks." A bank is formed of one or more "rows" of the array of memory cells. All banks within the rank share all address and control pins. All banks are independent, but in some embodiments only one bank in a rank can be accessed at a time. Because of electrical constraints, only a few DIMMs can be attached to a bus. Ranks help increase the capacity on a DIMM.

Multiple DRAM chips are used for every access to improve data transfer bandwidth. Multiple banks are provided so that the computing system can be simultaneously working on different requests. To maximize density, arrays within a bank are made large, rows are wide, and row buffers are wide (8 KB read for a 64 B request). Each array provides a single bit to the output pin in a cycle (for high density and because there are few pins). DRAM chips are often described as xN, where N refers to the number of output pins; one rank may be composed of eight ×8 DRAM chips (e.g., the data bus is 64 bits). Banks and ranks offer memory parallelism, and the memory controller 101 may schedule memory accesses to maximize row buffer hit rates and bank/rank parallelism.

In the embodiment illustrated in FIG. 1, the memory media device 126 is low power double data rate (LPDDR) LP5 or LP5A DRAM media. However, embodiments are not limited thereto, and memory media device 126 may comprise one or more memory media of any memory media types, such as, but not limited to, types of DRAM, that are subject to row hammer attacks or similar memory attacks.

Each of the plurality of media controllers 120 can receive a same command and address and drive the plurality of channels 125 substantially simultaneously. By using the same command and address for the plurality of media controllers, each of the plurality of media controllers 120 can utilize the plurality of channels 125 to perform the same memory operation on the same plurality memory cells. Each media controller 120 can correspond to a RAID component. As used herein, the term "substantially" intends that the characteristic need not be absolute, but is close enough so as to achieve the advantages of the characteristic.

For example, "substantially simultaneously" is not limited to operations that are performed absolutely simultaneously and can include timings that are intended to be simultaneous but due to manufacturing limitations may not be precisely simultaneously. For example, due to read/write delays that may be exhibited by various interfaces (e.g., LPDDR5 vs. PCIe), media controllers that are utilized "substantially simultaneously" may not start or finish at exactly the same time. For example, the multiple memory controllers can be utilized such that they are writing data to the memory devices at the same time regardless of whether one of the media controllers commences or terminates prior to the other.

DRAM is organized as an array of storage cells with each cell storing a programmed value. As noted above, the cells can lose their programmed values if not periodically refreshed. Thus, the rows are refreshed at a fixed interval often referred to as the "refresh interval." The refresh is also called a "row activation." In a row activation, a row in the DRAM device is read, error corrected and written back to that same physical row. Data corruption caused by "row hammer events" (also referred to as "row hammer attacks") are a significant risk in recent DRAM devices.

A row hammer trigger event occurs when a particular row in a media device is accessed multiple times in a short period of time, that is, more than a "row hammer threshold" (RHT) number of times, in an "activation interval" (i.e., the interval between two refresh/activation events). Specifically, when a particular row (an "aggressor row") is accessed more than a RHT number of times during an activation interval, one or more rows ("victim rows") that are physically proximate to that particular row in the DRAM media can be affected as a result of the frequent activation of the particular row, and data corruption of the one or more rows may occur.

Due to various physical effects of shrinking manufacturing process geometries, the RHT of memory devices has decreased to a level at which even normal computer system programs can inadvertently corrupt their own data or the data of another program sharing the same system's memory. Conventional row hammer detection techniques are either practical but imperfect allowing data corruption or severe performance degradation, or perfect but impractically costly in required resources such as silicon area.

If an aggressor (e.g., a malicious attacker) knows sufficient details of these conventional row hammer detection methods and their implementation, the aggressor can attack their weaknesses to bypass or break them and corrupt data. Currently, when a row hammer event exceeds the RHT of a memory device, a direct refresh management (DRFM or dRFM) operation is invoked. Typically, a DRFM operation includes the issuing of multiple back-to-back ACT commands, each taking excess time in which the affected memory row is not accessible thereby increasing latency and decreasing overall memory bandwidth.

Figure 2A:
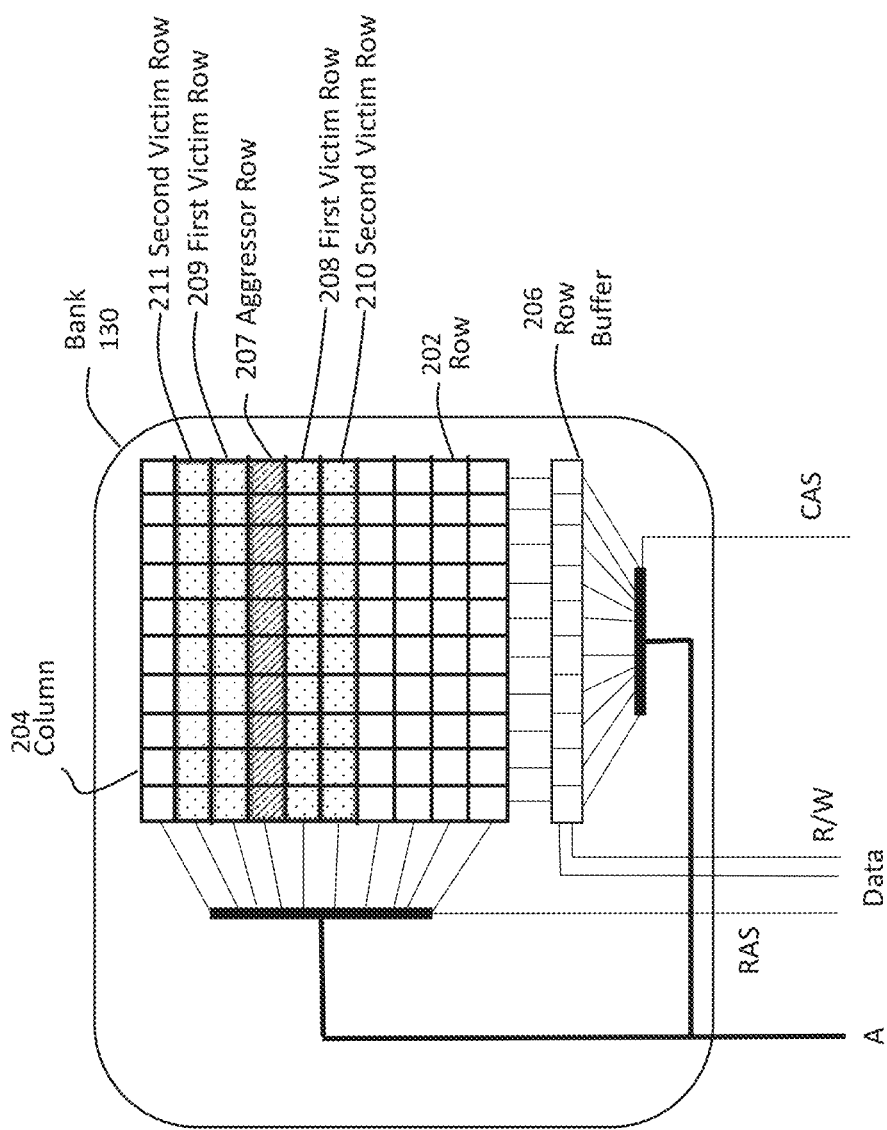
FIG. 2A illustrates a schematic view of a memory bank in a DRAM media device.

FIG. 2A illustrates a schematic view of the memory bank 130 viewed in a DRAM device such as memory media device 126. The illustrated example memory bank 130 represents a 10×10 array of cells organized in 10 rows (e.g., row 202) and 10 columns (e.g., column 204). The number of cells, size, and configuration are for illustrative purposes only and could be any size and configuration. The bank is stored to or read from, one row at a time, via a row buffer 206. Each cell in the array is accessed by providing a row address and a column address. The address bus, a row access strobe signal, a column access strobe signal (shown in FIG. 2A as A, RAS, CAS, respectively) are used to access particular memory locations in the array. The row buffer 206 and the data or read/write signals are used for the data to be read from or stored to memory locations.

Rows 207, 208, 209, 210 and 211 illustrate an example aggressor row 207 and one or more proximate rows (e.g., first victim rows 208 and 209, second victim rows 210 and 211) on either side of the aggressor row 207. As noted above, when the aggressor row 207 is accessed more than a RHT number of times during a particular interval such as the refresh interval, it may be expected that the data stored in the victim rows 208 and 209 and possibly 210 and 211 may be corrupted and thus those victim rows need to be refreshed.

First victim rows 208 and 209 may also be referred to as +/−1 rows, with rows 210 and 211 being referred to as +/−2 rows. The RHT, and the number of rows on each side of the aggressor row that are considered victim rows, may be memory device dependent. In some memory devices, a counter, not shown in FIG. 2A, may be associated with a row to keep track of the number of times that row has been activated during a particular time interval.

For example, the counter may be initialized at the beginning of each refresh interval and be incremented for each access to that row during that refresh interval. In conventional perfect tracking implementations, a respective counter was associated with each row. Since memory media devices 126 can have millions or even billions of rows, having a counter for each physical row in the memory device can be very costly in terms of the area (e.g., silicon or memory area) required for the counters.

In example embodiments, the number of ACT counters maintained for the purpose of memory error detection due to excessive row accesses is much smaller than the total number of rows in the memory device(s) attached to the memory controller. Instead of providing and operating an ACT counter for each individual memory media row that can be logically addressed by a memory controller as is done in prefect row tracking, operationally share (or alias) one ACT counter among more than one memory media row, thus reducing the amount of ACT counters required to be provided to detect and prevent row hammer data corruption in a memory system by the amount of counters that share each ACT counter example. While aliasing of ACT counters reduces the number of ACT counters, when a specific ACT counter reaches a row hammer threshold value, the location of the actual aggressor row may not be known and thus all the rows that share, e.g., alias, the specific ACT counter must be refreshed.

Figure 2B:
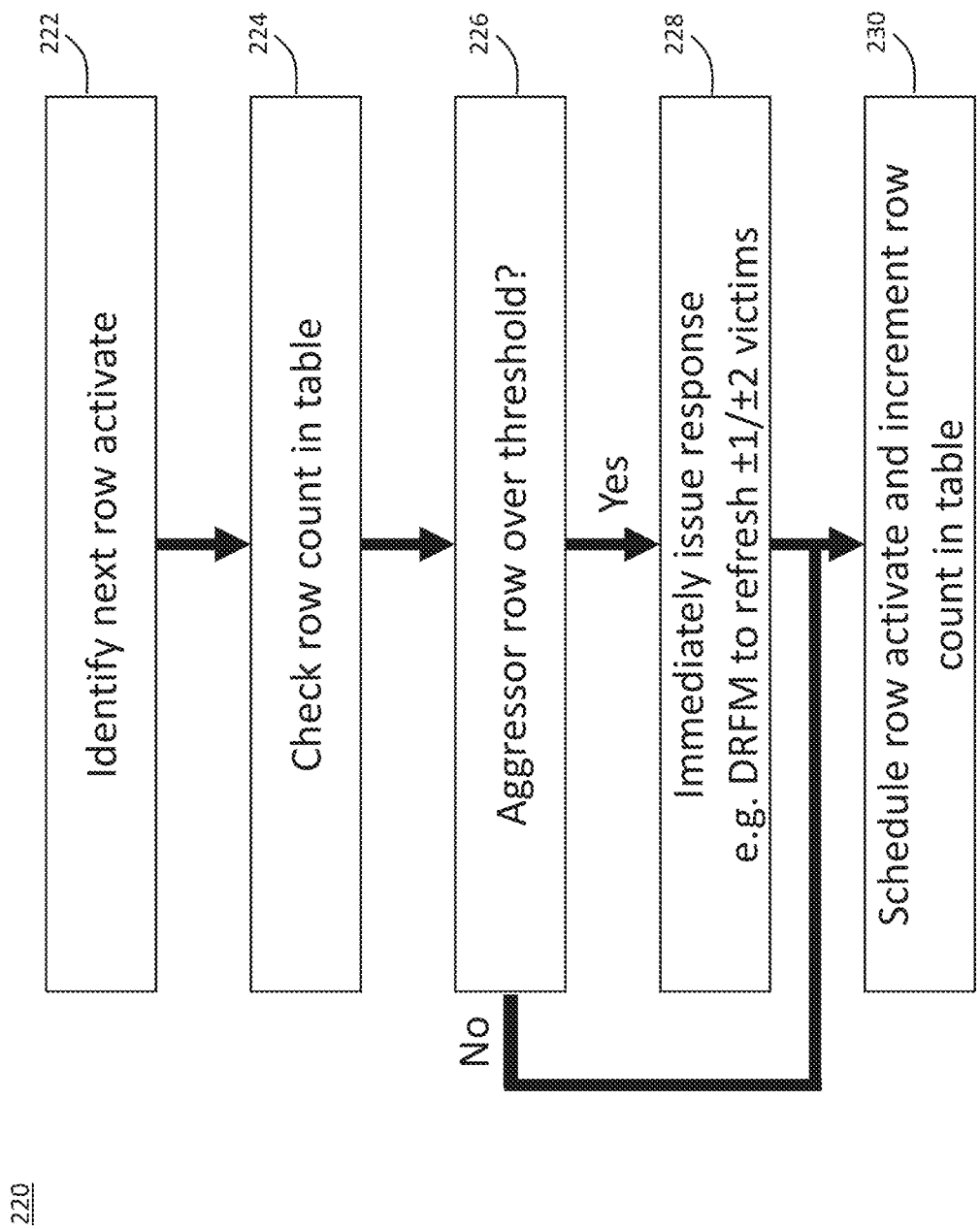
FIG. 2B illustrates a flowchart depicting a basic implementation flow of row hammer mitigation, according to an embodiment of the present disclosure.

FIG. 2B illustrates a flowchart 220 depicting a basic implementation flow of row hammer mitigation. Row hammer mitigation includes two aspects: the first aspect is row hammer detection, and the second aspect is the response to that detection. A variety of responses are possible, with a response commanding the memory media device 126 to refresh victim rows (e.g., DRFM response) being one of the possible responses to mitigate or eliminate the effects of row hammer effects. In some instances, the memory controller transmits a refresh command, such as a DRFM response, to the memory media device 126 and specifies the aggressor row, and the memory device's internal circuitry determines the victim rows to be refreshed based on the aggressor row identified by the memory controller and refreshes the victim rows.

When a request is received to access a row, which may be referred to as the "aggressor row" (aggressor row 207 in FIG. 2A) in this disclosure, in the memory media device 126, at operation 222 that row is identified as the next row to activate. At operation 224, a value of a counter configured to keep track of the number of accesses to the aggressor row, in a predetermined time period, is checked. At operation 226, it is determined whether the value of the counter is above the RHT. When the RHT is exceeded for the aggressor row 207, the integrity of the data in one or more rows (referred to as "first victim rows"; see rows 208 and 209 and "second victim rows"; see rows 210 and 211 in FIG. 2A) physically adjacent (+/−1, +/−2) to the aggressor row 207 cannot be guaranteed. The RHT may be factory set or may be configured at boot time. If the value is above the RHT, then at operation 228 a response is issued.

One type of response may be a DRFM command to refresh the physically adjacent rows (e.g., rows 208, 209, 210 and 211) on either side of the aggressor row 207. When a response is issued at operation 218, the counters of the victim rows (e.g., rows 208, 209, 210, and 211) which are refreshed can be reset (e.g., set the count value to 0). Note that the aggressor row's counter is reset when its count exceeds RHT, and a response is issued to refresh its victim rows. The number of physically adjacent rows to refresh may be preconfigured or may be dynamically determined. After issuing the response at 218, or if at operation 216 it was determined that the aggressor row 207 is not over the RHT, at operation 230, the row activate for the aggressor row is scheduled and the counter for that row is incremented (e.g., incremented by 1).

In FIG. 1, the row hammer mitigation component 132 is illustrated as being arranged within the memory controller 101. However, in some other embodiments, the row hammer mitigation component 132 can be arranged in the memory media device 126. In yet other example embodiments, the row hammer mitigation component 132 may not be arranged within either the memory media device 126 or within memory controller 101, but externally to both memory media device 126 and memory controller 101. In example embodiments, the row hammer mitigation component 132 receives row access counts of the memory media device 126 as input and provides a response to detected row hammer events as output.

In some embodiments, having the row hammer mitigation component 132 arranged in the memory controller 101 enables taking advantage of the fact that the memory controller communicates with all memory media devices 126 that are attached. For example, row hammer mitigation component 132 on the memory controller 101 can use common row addresses among multiple memory media devices 126 in a group of one or more channels. In an example embodiment in which 15 DRAM devices are attached to the memory controller 101, a channel may be configured to group 5 of the DRAM devices together such that they respond to the same row addresses (row IDs) from the memory controller.

In respectively different example embodiments, in the memory controller 101, the row hammer mitigation component 132 may be arranged within the central controller portion 110, at a channel level in a media controller 120 in the back end portion 119, or at a bank level in a memory bank 130. For example, at the central controller portion 110, the row hammer mitigation component 132 may monitor may monitor all rows in all memory media devices 126 connected to all media controllers 120; at the channel level, a plurality of row hammer mitigation components 132 may be implemented with each monitoring the rows configured as belonging to that channel; and at the bank level, a plurality of row hammer mitigation components 132 may be implemented with each monitoring the rows configured as belonging to that bank.

A problem with having a separate counter for each row that is being monitored is that, as a big system is created, the memory may grow to many millions of rows. Then having a billion counters, one per row, may yield a billion counters. Thus, various approaches may be considered to achieve row hammer tracking in the memory controller by accessing multiple rows as one unit (same row on different chips) and thus having only one counter for the group, rather than having a counter for each row of the media device. The use of using a single counter for multiple memory rows may also be referred to as a high aliasing tracking policy or an aliasing row counter policy. The more rows that use the single counter the higher the aliasing tracking and as a benefit, the smaller the area of controller circuits in the controller.

For example, in an 8× aliasing row counter policy in a CXL controller every two sets of rows of memory in a single bank share the same row hammer counter. Consequently, when a RHT trigger event is detected and a DRFM command is issued, in actuality two DRFM commands must be executed. The first DRFM command performs a refresh on the first set of memory row of the two sets of rows of memory sharing the row hammer counter with a second DRFM command then executed on the second set of memory rows of the two sets of rows sharing the row hammer counter. Thus, in a general case, a default DRFM operation will spend approximately four row cycle times (4×tRC) to treat +/−1 and +/−2 victim rows. A row cycle times may be defined as the minimum period of time between two back-to-back ACT commands. Therefore, as an example if the typical time to perform a DRFM command is approximately 500 ns, then the associated latency penalty for an 8× aliasing row counter policy to execute two DRFM commands will be 1 μs.

In a 16× aliasing row counter policy, the impact is double that of the 8× aliasing policy. The 16× aliasing row counter policy includes having four sets of rows of memory within a bank sharing the same row hammer counter. Therefore, when a RHT trigger event is detected, four DRFM commands are issued, one for each of the four sets of rows. With four DRFM command the associated latency penalty in the 16× aliasing policy increases to 2 μs. The above examples of an 8× and 16× aliasing row counter policy is not the only possible aliasing policies but are just used as illustrative examples.

FIG. 3A illustrates a mode register that may be used, for example in row hammer mitigation component 132, to select the type of aliasing row counter policy that is desired. For example, if mode register is selected as MR[0:0], then the standard DRFM mode will be in effect and no aliasing is being implemented. In mode MR[0:0] when a RHT trigger event occurs the row hammer mitigation component 132 triggers a DRFM command on the affected victim rows.

If mode register is selected as MR[0:1], this could indicate an 8× aliasing policy where every two rows of memory in a single bank share the same row hammer counter, also can be referred to as a "2× wordline" DRFM mode. In this mode memory controller 101 would share, or alias two rows sharing RA[15:0] in the same counter with RA[16] is aliased or ignored as will be discussed in FIG. 5.

Similarly, if mode register is selected as MR[1:0], this could indicate a 16× aliasing policy where every four rows of memory in a single bank share the same row hammer counter and can also be referred to as a "4× wordline" DRFM mode. In this mode memory controller 101 would share, or alias four rows sharing RA[14:0] in the same counter with RA[16:15] aliased or ignored as will be discussed in FIG. 6.

Similarly, if mode register is selected as MR[1:1], this could indicate a 32× aliasing policy where every eight rows of memory in a single bank share the same row hammer counter and can also be referred to as a "8× wordline" DRFM mode. In this mode memory controller 101 would share, or alias eight rows.

Figure 3B:
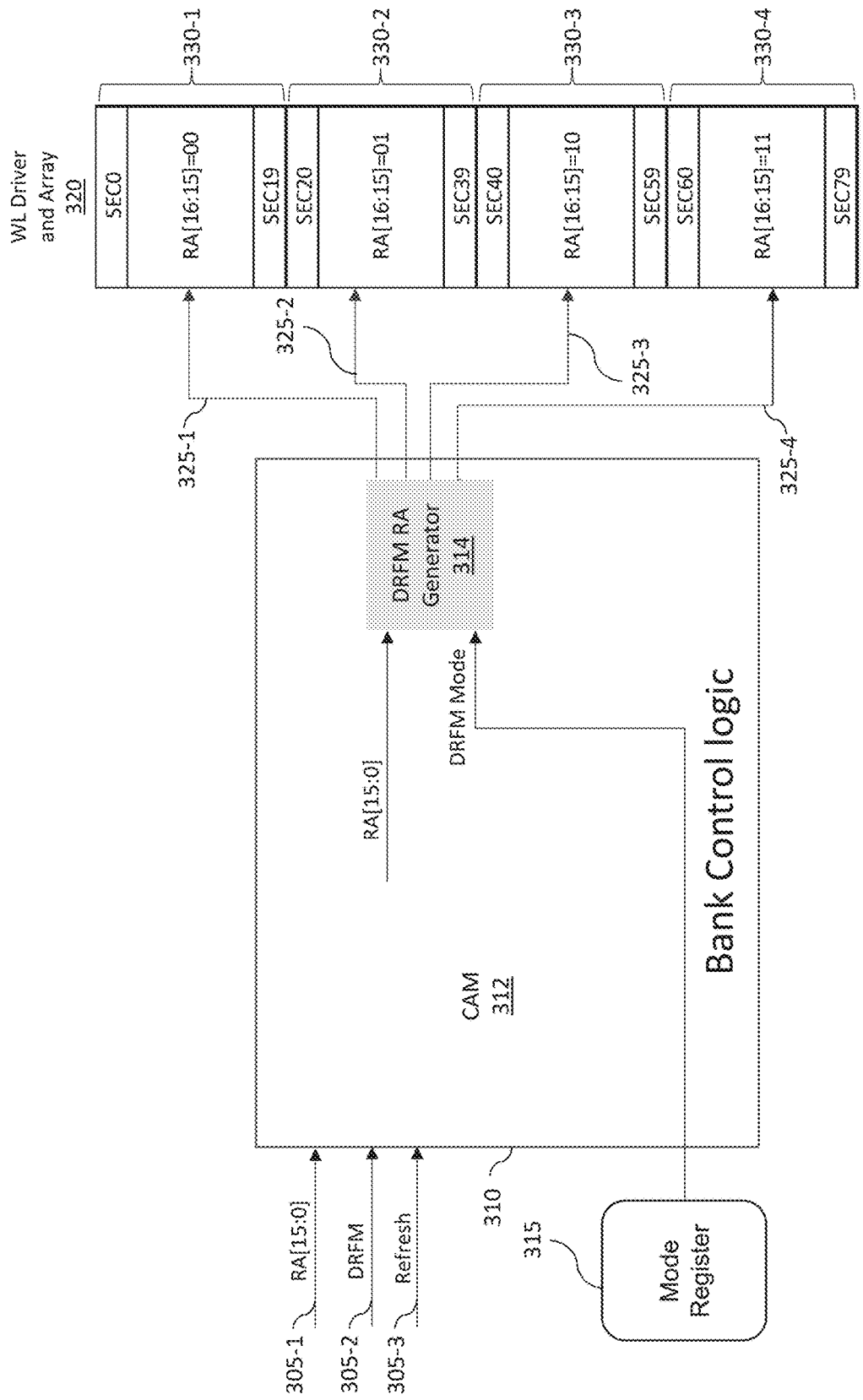
FIG. 3B illustrates a block diagram of a multi-wordline DRFM, according to an embodiment of the present disclosure.

FIG. 3B is a block diagram of a multi-wordline DRFM 300 according to an embodiment of the present disclosure. The multi-wordline DRFM 300 may include a bank control logic 310 that may include a content addressable memory (CAM) 312 and a DRFM row address (RA) generator 314. CAM 312 may receive an address from RA[15:0] 305-1 line and returns a data word stored at that address to DRFM 314.

DRFM RA 314 also receives a code from mode register 315 that controls whether DRFM RA 314 addresses a single or simultaneous multiple wordlines across memory sub-banks WL driver and array 320. For example, if mode register 315 elects a standard 1 wordline DRFM, only a single sub-bank, e.g., memory sub-bank 330-1 selected by line 325-1, would be addressed. If mode register 315 elects a 2× wordline DRFM, e.g., MR[0:1], then memory sub-banks 330-1 and 330-3 selected by lines 325-1 and 325-3, respectively, would be simultaneously selected.

If mode register 315 elects a 4× wordline DRFM, e.g., MR[1:0], then memory sub-banks 330-1, 330-2, 330-3, and 330-4 selected by lines 325-1, 325-2, 325-3 and 325-4, respectively, would be simultaneously selected. Bank control logic 310 may also accept other inputs, such as a DRFM request 305-2 and a refresh 305-3. Mode register 315 may also generate additional modes, for example an 8× wordline where 8 separate memory sub-banks may be addressed. In actuality, there is no upper limit on the number of memory sub-banks that may be simultaneously addressed.

Figure 4:
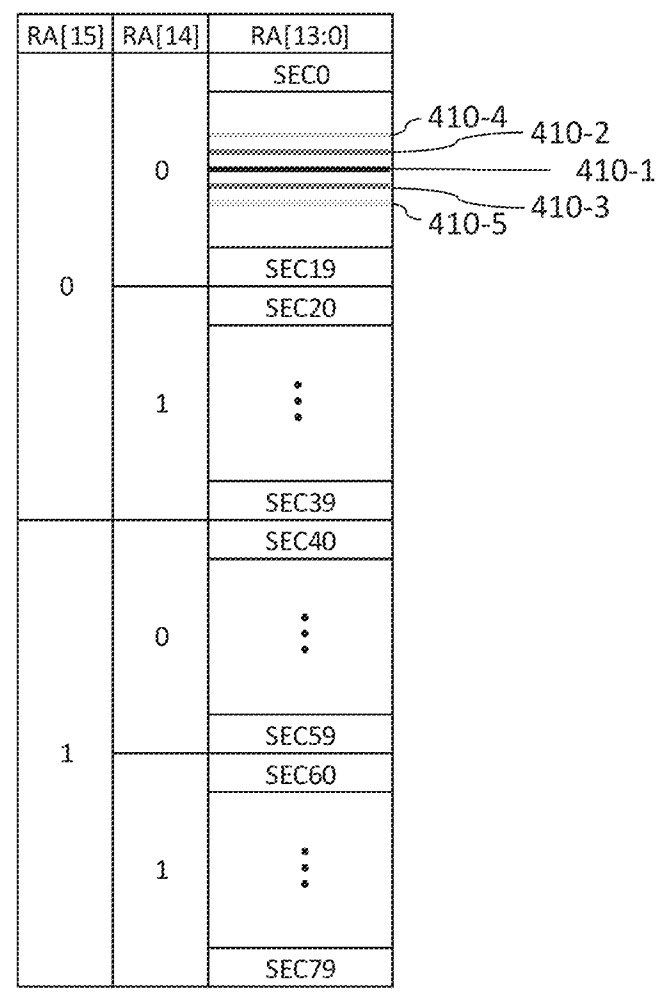

FIG. 4 illustrates an example of a memory bank with a single DRFM command, according to an embodiment of the present disclosure. As discussed in FIG. 2B, when a counter exceeds the RHT for a particular row, referred to as the aggressor row, the integrity of the victim rows cannot be guaranteed. In this situation, the controller may issue a DRFM command for the victim rows. In a single DRFM case, the controller, for example bank control logic 310, identifies row 410-1 as the aggressor row and therefore the +/−1 and +/−2 victim rows, e.g., first victim rows 410-2 and 410-3 and second victim rows 410-4 and 410-5, need to be refreshed.

FIG. 4 illustrates the identification of aggressor row 410-1 and the need to issue four separate ACT commands, one for each of the victim rows in response to a counter indicating access to the aggressor row exceeds the RHT value. Each ACT command is directed to a single wordline. The wordline may also be considered the address of the victim row. As previously discussed, a single DRFM operation may spend approximately four row cycles to treat the first and second victim rows, for a completion time of approximately 500 ns.

FIG. 5 illustrates an example of a memory bank with a 2× wordline aliasing mode multi-wordline DRFM command, according to an embodiment of the present disclosure. In a 2× wordline aliasing policy a row hammer counter is shared between two rows in a memory bank. If the value of the counter exceeds the RHT, since the counter is shared by two rows in a memory bank, it is unknown which of the rows contains the aggressor row that caused the counter to exceed the RHT. Therefore, the victim rows of both of the possible aggressor rows must be refreshed with a DRFM operation. FIG. 5 illustrates that the two possible aggressor rows are shown as aggressor row 410-1 and aggressor row 510-1. Further, aggressor row 410-1 is associated with first victim rows 410-2 and 410-3, and with second victim rows 410-4 and 410-5. Aggressor row 510-1 is associated with first victim rows 510-2 and 510-3, and with second victim rows 510-4 and 510-5.

In the past, two DRFM operations would be needed to refresh all the victim rows in a 2× alias. A first DRFM operation would be issued for victim rows 410-2, 410-3, 410-4, and 410-5. A second DRFM operation would then be issued for victim rows 510-2, 510-3, 510-4, and 510-5. As previously discussed, a single typical DRFM operation may require approximately 500 ns to complete. In the case of the 2× aliasing, two DRFM operations are performed, introducing an additional 500 ns latency, for a total of 1 μs for the two DRFM operations to complete.

To eliminate the additional latency, the present disclosure uses a controller to perform the two DRFM operations on both sets of victim rows concurrently. Thus, as shown in FIG. 5, the DRFM operation will be perform on both sides of RA[16]=0 and 1 concurrently. As RA[16]=0 and RA[16]=1 are physically distinct areas of the memory bank, the aggressor rows 410-1 and 510-1, and their associated victim rows, can be guaranteed to not be in the same, or neighboring sections, of the memory bank.

Further, each DRFM operation is directed to two wordlines simultaneously. In other words, the controller aliases RA[16] so that the two rows sharing RA[15]=0 with the same counter are refreshed with the same DRFM operation. Accordingly, each ACT command is addressed to two wordlines simultaneously. For example, a first ACT command is directed to first victim rows 410-2 and 510-2. A second ACT command is then directed to first victim rows 410-3 and 510-3. A third ACT command is then directed to second victim rows 410-4 and 510-4. And a fourth ACT command is then directed to second victim rows 410-5 and 510-5. Thus, a total of 8 wordlines have been served with 4 ACT commands. Thus, the complete DRFM operation, using the 500 ns example, may be completed without any additional induced latency. The example order of ACT commands is by way of example only and can be any sequence as dictated by the controller.

Figure 6:
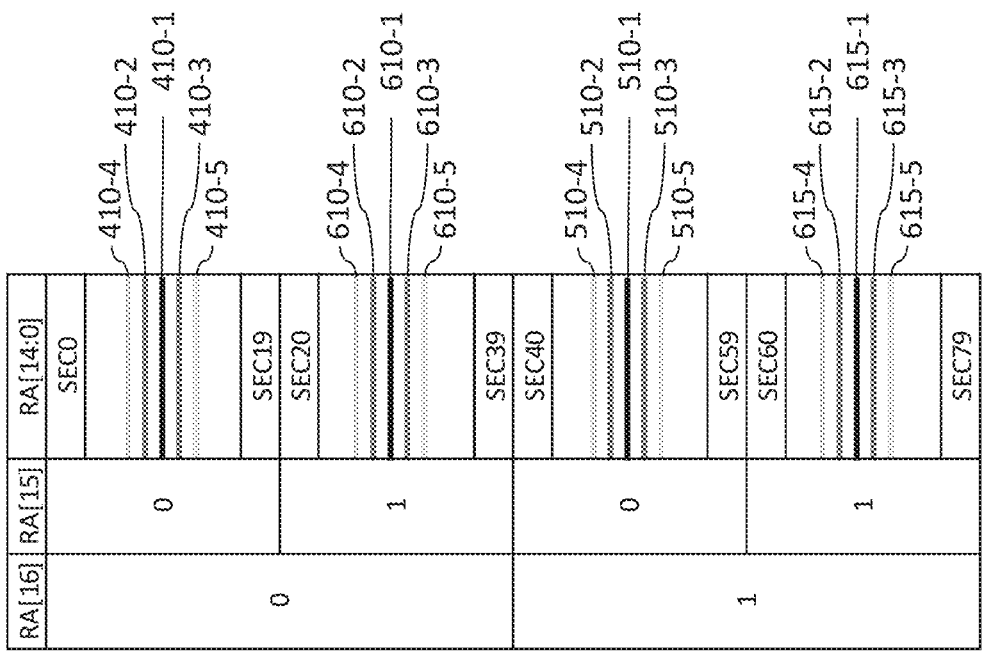
FIG. 6 illustrates an example of a memory bank with a 4× wordline aliasing mode multi-wordline DRFM command, according to an embodiment of the present disclosure.

FIG. 6 illustrates an example of a memory bank with a 4× aliasing mode multi-wordline DRFM command, according to an embodiment of the present disclosure. In a 4× aliasing policy a row hammer counter is shared between four rows in a memory bank. If the value of the counter exceeds the RHT, since the counter is shared by four rows in a memory bank, it is unknown which of the rows contains the aggressor row that caused the counter to exceed the RHT. Therefore, the victim rows of all four of the possible aggressor rows must be refreshed with a DRFM operation.

FIG. 6 illustrates that the four possible aggressor rows are shown as aggressor rows 410-1, 510-1, 610-1, and 615-1. Further, aggressor row 410-1 is associated with first victim rows 410-2 and 410-3, and with second victim rows 410-4 and 410-5. Aggressor row 510-1 is associated with first victim rows 510-2 and 510-3, and with second victim rows 510-4 and 510-5. Aggressor row 610-1 is associated with first victim rows 610-2 and 610-3, and with second victim rows 610-4 and 610-5. Aggressor row 615-1 is associated with first victim rows 615-2 and 615-3, and with second victim rows 615-4 and 615-5.

In the past, four DRFM operations would be needed to refresh all the victim rows in a 4× alias. A first DRFM operation would be issued for victim rows 410-2, 410-3, 410-4, and 410-5. A second DRFM operation would then be issued for victim rows 510-2, 510-3, 510-4, and 510-5. A third DRFM operation would then be issued for victim rows 610-2, 610-3, 610-4, and 610-5. A fourth DRFM operation would then be issued for victim rows 615-2, 615-3, 615-4, and 615-5. As previously discussed, a single typical DRFM operation may last for approximately 500 ns. In the case of the 4× aliasing, four DRFM operations would need to be performed, introducing an additional 3×500 ns latency, for a total of 2 μs for the four DRFM operations to complete.

To eliminate the additional latency, the present disclosure uses a controller to perform the four DRFM operations on all sets of victim rows concurrently. Thus, as shown in FIG. 6, the DRFM operation will be performed on both sides of RA[16]=0 and 1 and RA[15]=0 and 1 concurrently. As RA[16]=0 and RA[16]=1, and RA[15]=0 and RA[15]=1, are physically distinct areas of the memory bank, the aggressor rows 410-1, 610-1, 510-1, and 615-1, and their associated victim rows, can be guaranteed to not be in the same, or neighboring sections referred to as sub-banks of the memory bank.

Further, each DRFM operation is directed to four wordlines simultaneously. In other words, the controller aliases RA[16] and RA[15] so that the four rows sharing RA[16]=0 and 1 and RA[15]=0 and 1, with the same counter are refreshed with the same DRFM operation. Accordingly, each ACT command is addressed to four wordlines simultaneously. For example, a first ACT command is directed to first victim rows 410-2, 610-2, 510-2, and 615-2. A second ACT command is then directed to first victim rows 410-3, 610-3, 510-3, and 615-3. A third ACT command is then directed to second victim rows 410-4, 610-4, 510-4, and 615-4. And a fourth ACT command is then directed to second victim rows 410-5, 610-5, 510-5, and 615-5. Thus, a total of 16 wordlines have been served with 4 ACT commands. Thus, the complete DRFM operation, using the 500 ns example, may be completed without any additional induced latency. The example order of ACT commands is by way of example only and can be any sequence as dictated by the controller.

Figure 7:
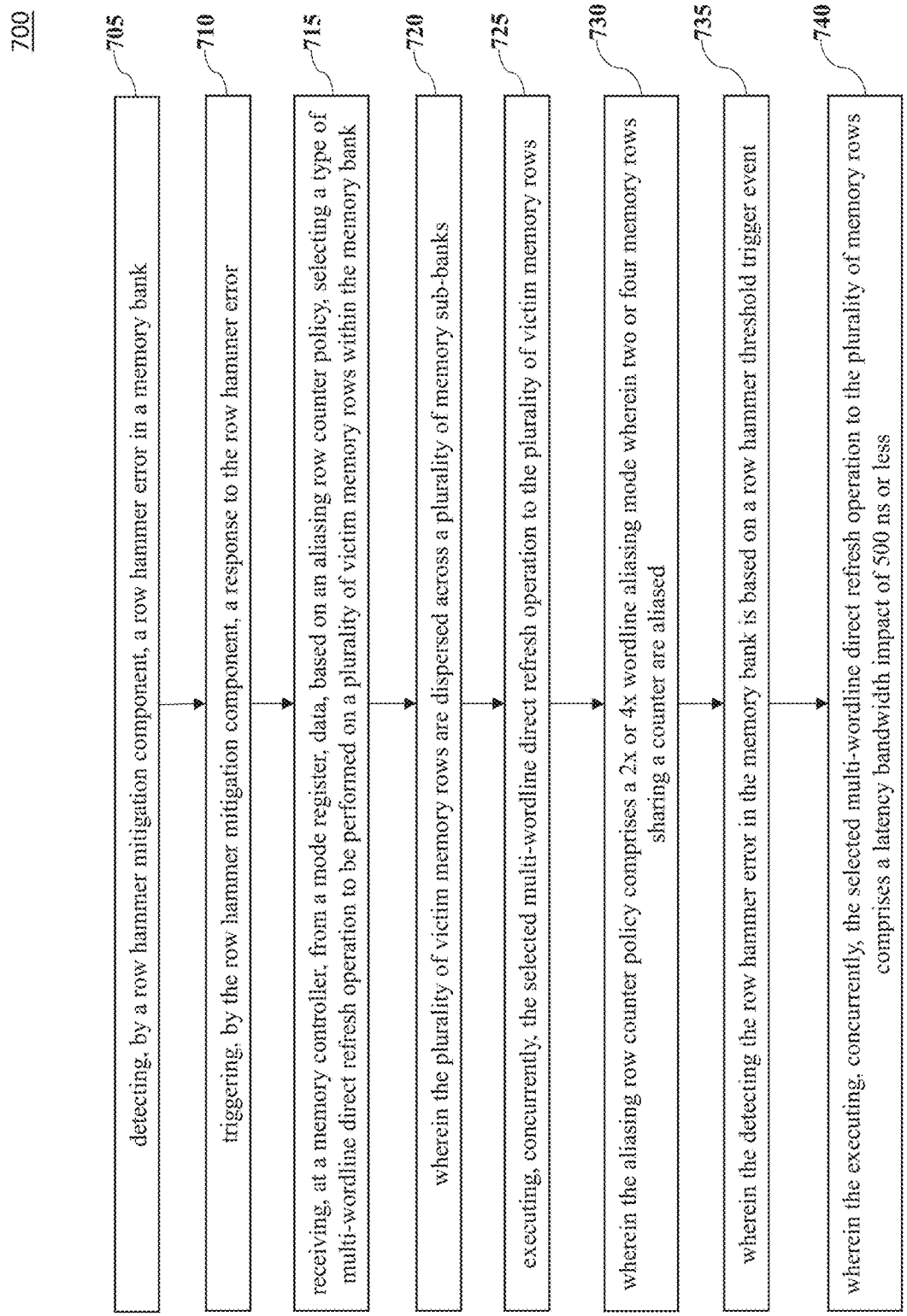
FIG. 7 is a flow diagram of an example method for a multi-wordline DRFM operation, according to an embodiment of the present disclosure.

FIG. 7 shows an exemplary embodiment of a method 700 for a DRFM operation, according to an embodiment of the present disclosure. Method 700 begins at step 705 with the detecting with a row hammer mitigation component a row hammer error in a memory bank. As discussed in FIG. 1, a computing system 100 may include a memory controller 101 to detect row hammer attacks. The memory controller 101, or for example bank control logic 310, may contain ACT counters possibly within content addressable memory, which store the number of memory row accesses. In the event of excessive row access where a specific ACT counter reaches or reaches and exceeds a predetermined row hammer threshold value then the memory row or rows associated with the ACT counter is identified as an aggressor row or rows. In the instance where an aliasing policy, also referred to as a high aliasing tracking policy of an aliasing row counter policy, is in effect a single ACT counter is associated with multiple memory rows. Thus, when a row hammer threshold trigger event is detected the actual aggressor row may be located in one of several memory sub-blocks associated with the single ACT counter.

Step 710 continues by triggering, in response to the detecting of the row hammer error, a response to the row hammer error. The row hammer mitigation component, which may or may not be part of a memory controller or bank control logic, may initiate a response by executing one or more refresh commands. As previously discussed, when a RHT is exceeded for a particular row, known as an aggressor row, that adjacent memory rows, known as victim rows, that are physically proximate to the aggressor row may be affected resulting in corrupted or changed data. When such an event is detected the row hammer mitigation component may issue an ACT command to refresh the victim rows.

For example, RH mitigation component 132 may receive row access statistics for the memory media device 126 and may output a response to refresh one or more rows of the memory media device 126. As discussed in FIG. 2A, illustrated rows 207, 208, 209, 210 and 211 illustrate an example aggressor row 207 and one or more proximate rows (e.g., first victim rows 208 and 209, second victim rows 210 and 211) on either side of the aggressor row 207. When the aggressor row 207 is accessed more than a RHT number of times during a particular interval such as the refresh interval, it may be expected that the data stored in the victim rows 208 and 209 and possibly 210 and 211 can be corrupted and thus those victim rows need to be refreshed.

Step 715 continues by receiving, at a memory controller, from a mode register, data, based on an aliasing row counter policy, selecting a type of multi-wordline direct refresh operation to be performed on a plurality of victim memory rows within the memory bank. As discussed, memory aliasing is where multiple entries are mapped to shar the same memory location. It is possible to dedicate an ACT counter to every memory row, but such a design requires large amounts of memory and space on a chip.

For example, with no aliasing, or when the alias factor is set to 1, over 134 million ACT counters would be required for 128 MB of uniquely addressable memory media rows. With an alias factor of 4 the amount of ACT counters is reduced to approximately 33 million. With an alias factor of 8 the number is further reduced to approximately 16 million; with an alias factor of 16 the number of counters is approximately 8 million; and with an alias factor of 32 the number of counters is further reduced to approximately 4 million. Thus, the use of memory aliasing saves space and power.

As discussed in FIG. 3A, a mode register may be used, for example in row hammer mitigation component 132, to select the type of aliasing row counter policy that is desired. For example, if mode register is selected as MR[0:1], this could indicate an 8× aliasing policy where every two rows of memory in a single bank share the same row hammer counter, also can be referred to as a "2× wordline" DRFM mode. In this mode memory controller 101 would share, or alias two rows sharing RA[15:0] in the same counter with RA[16] is aliased. Similarly, if mode register is selected as MR[1:0], this may indicate a 16× aliasing policy where every four rows of memory in a single bank share the same row hammer counter and can also be referred to as a "4× wordline" DRFM mode.

In this mode memory controller 101 would share, or alias four rows sharing RA[14:0] in the same counter with RA[16:15] aliased. Similarly, if mode register is selected as MR[1:1], this could indicate a 32× aliasing policy where every eight rows of memory in a single bank share the same row hammer counter and can also be referred to as a "8×wordline" DRFM mode. In this mode memory controller 101 would share, or alias eight rows. Thus, step 715 the controller selects the appropriate DRFM mode as requested by the mode register.

Step 720 continues as a further function of step 715, wherein the plurality of victim memory rows is dispersed across a plurality of memory sub-banks, for example as shown in FIGS. 3B and FIGS. 4-6. FIG. 3B illustrates a memory bank labeled WL driver and array 320 with sub-banks 330-1, 330-2, 330-3, and 330-4. Thus, if the mode register selects MR[0:1] with a 2× wordline then memory sub-banks 330-1 and 330-3 are selected. If the mode register selects MR[1:0] then memory sub-banks 330-1, 330-2, 330-3, and 330-4 are selected.

Step 725 continues by executing, concurrently, the selected multi-wordline direct refresh operation to the plurality of victim memory rows. As discussed in FIG. 5, a memory bank with a 2× wordline aliasing mode multi-wordline DRFM command is illustrated where a 2× wordline aliasing policy with a row hammer counter is being shared between two rows in a memory bank. If the value of the counter exceeds the RHT, since the counter is shared by two rows in a memory bank, it is unknown which of the rows contains the aggressor row that caused the counter to exceed the RHT. Therefore, the victim rows of both of the possible aggressor rows must be refreshed with a DRFM operation.

FIG. 6 illustrates an example of a memory bank with a 4× aliasing mode multi-wordline DRFM command where a 4× wordline aliasing policy a row hammer counter is being shared between four rows in a memory bank. If the value of the counter exceeds the RHT, since the counter is shared by four rows in a memory bank, it is unknown which of the rows contains the aggressor row that caused the counter to exceed the RHT. Therefore, the victim rows of all four of the possible aggressor rows must be refreshed with a DRFM operation. Step 725 specifies that the selected multi-wordline direct refresh operation is performed concurrently. As discussed, to eliminate any additional latency associated with executing DRFM commands sequentially, the present disclosure alias multiple row address lines such that as shown in FIG. 5, the DRFM operation will be perform on both sides of RA[16]=0 and 1 concurrently. And, as shown in FIG. 6, the DRFM operation will be performed on both sides of RA[16]=0 and 1 and RA[15]=0 and 1 concurrently.

Step 730 allows for the option of selecting the 2× or 4× wordline aliasing mode as discussed above in step 725.

Step 735 further specifies that the detecting the row hammer error in the memory bank may be based on a row hammer threshold trigger event. A row hammer trigger event occurs when a particular row in a media device is accessed multiple times in a short period of time, that is, more than a RHT number of times, in an "activation interval" (i.e., the interval between two refresh/activation events).

Step 740 adds the limitation that the concurrent executing of DRFM operations as shown in step 725, limit the total latency to a single set of DRFM operations across multiple sub-banks wherein the executing, concurrently, the selected multi-wordline direct refresh operation to the plurality of memory rows comprises a latency bandwidth impact of 500 ns or less. The method then ends.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

It should be noted that the methods described above describe possible implementations, and that the operations and the steps may be rearranged or otherwise modified and that other implementations are possible. Further, portions from two or more of the methods may be combined.

What is claimed is:

1. A system comprising:
   a memory media device comprising at least one bank of memory, each bank comprising a plurality of memory sub-banks;
   a memory controller coupled to a host and configured to (i) use an aliasing row counter policy and (ii) detect a row hammer error in the at least one bank of memory;
   a mode register configured to generate data, based on the aliasing row counter policy, selecting a type of multi-wordline direct refresh operation to be performed on a plurality of victim memory rows within the at least one bank of memory, the plurality of victim memory rows being dispersed across the plurality of memory sub-banks; and
   a row hammer mitigation component configured to execute the selected multi-wordline direct refresh operation to the plurality of victim memory rows concurrently.

2. The system of claim 1, wherein the memory media device is dynamic random access memory (DRAM), and wherein each memory sub-bank of the plurality of memory sub-banks correspond to a plurality of rows in the DRAM.

3. The system of claim 1, wherein the aliasing row counter policy comprises a 2× wordline aliasing mode wherein two memory rows sharing a counter are aliased.

4. The system of claim 1, wherein the aliasing row counter policy comprises a 4× wordline aliasing mode wherein four memory rows sharing a counter are aliased.

5. The system of claim 1, wherein the aliasing row counter policy comprises an 8× aliasing mode wherein eight memory rows sharing a counter are aliased.

6. The system of claim 1, wherein the row hammer mitigation component is arranged in the memory media device.

7. The system of claim 1, wherein the row hammer mitigation component is arranged in the memory controller.

8. The system of claim 1, wherein the memory controller is further configured to detect the row hammer error in the at least one bank of memory is based on a row hammer threshold trigger event.

9. A memory controller comprising:
   a first interface to a host system;
   a second interface (i) coupled to a memory media device and (ii) comprising a plurality of physical interfaces to the memory media device, each of the plurality of physical interfaces corresponding to a respective channel having a plurality of memory banks;
   a mode register configured to generate data, based on an aliasing row counter policy, selecting a type of multi-wordline direct refresh operation to be performed on a plurality of victim memory rows within the plurality of memory banks, the plurality of victim memory rows being dispersed across a plurality of memory sub-banks; and
   a row hammer mitigation component configured to execute the selected multi-wordline direct refresh operation to the plurality of victim memory rows concurrently.

10. The memory controller of claim 9, wherein the memory media device is dynamic random access memory (DRAM), and wherein each memory sub-bank of the plurality of memory sub-banks correspond to a plurality of rows in the DRAM.

11. The memory controller of claim 9, wherein the aliasing row counter policy comprises a 2× wordline aliasing mode wherein two memory rows sharing a counter are aliased.

12. The memory controller of claim 9, wherein the aliasing row counter policy comprises a 4× wordline aliasing mode wherein four memory rows sharing a counter are aliased.

13. The memory controller of claim 9, wherein the aliasing row counter policy comprises an 8× aliasing mode wherein eight memory rows sharing a counter are aliased.

14. The memory controller of claim 9, further configured to detect a row hammer error in the plurality of memory banks based on a row hammer threshold trigger event.

15. A method comprising:
   detecting, by a row hammer mitigation component, a row hammer error in a memory bank; triggering, by the row hammer mitigation component, a response to the row hammer error;
   receiving, at a memory controller, from a mode register, data, based on an aliasing row counter policy, selecting a type of multi-wordline direct refresh operation to be performed on a plurality of victim memory rows within the memory bank, the plurality of victim memory rows being dispersed across a plurality of memory sub-banks; and
   executing the selected multi-wordline direct refresh operation to the plurality of victim memory rows concurrently.

16. The method of claim 15, wherein the aliasing row counter policy comprises a 2× wordline aliasing mode wherein two memory rows sharing a counter are aliased.

17. The method of claim 15, wherein the aliasing row counter policy comprises a 4× wordline aliasing mode wherein four memory rows sharing a counter are aliased.

18. The method of claim 15, wherein the aliasing row counter policy comprises an 8× aliasing mode wherein eight memory rows sharing a counter are aliased.

19. The method of claim 15, wherein the detecting the row hammer error in the memory bank is based on a row hammer threshold trigger event.

20. The method of claim 15, wherein the executing, concurrently, the selected multi-wordline direct refresh operation to the plurality of victim memory rows comprises a latency bandwidth impact of 500 ns or less.

* * * * *